(12) United States Patent
Olariu

(10) Patent No.: US 7,723,153 B2
(45) Date of Patent: May 25, 2010

(54) PRINTED ORGANIC LOGIC CIRCUITS USING AN ORGANIC SEMICONDUCTOR AS A RESISTIVE LOAD DEVICE

(75) Inventor: Viorel Olariu, Colorado Springs, CO (US)

(73) Assignee: OrganicID, Inc., Colorado Springs, CO (US)

(*) Notice: Subject to any disclaimer, the term of this patent is extended or adjusted under 35 U.S.C. 154(b) by 0 days.

(21) Appl. No.: 11/964,541

(22) Filed: Dec. 26, 2007

(65) Prior Publication Data

US 2009/0170237 A1 Jul. 2, 2009

(51) Int. Cl.
*H01L 29/76* (2006.01)
(52) U.S. Cl. ............... 438/99; 257/369; 257/40; 257/E21.422
(58) Field of Classification Search .......... 438/99
See application file for complete search history.

(56) References Cited

U.S. PATENT DOCUMENTS

| | | | | |
|---|---|---|---|---|
| 5,463,586 A | * | 10/1995 | Chao et al. ............... | 365/205 |
| 5,623,216 A | * | 4/1997 | Penza et al. .............. | 326/27 |
| 5,970,318 A | * | 10/1999 | Choi et al. ............... | 438/99 |
| 6,087,196 A | * | 7/2000 | Sturm et al. ............. | 438/29 |
| 6,284,562 B1 | * | 9/2001 | Batlogg et al. .......... | 438/99 |
| 6,362,509 B1 | * | 3/2002 | Hart ........................ | 257/369 |
| 6,788,158 B2 | * | 9/2004 | Kato et al. ............... | 331/116 R |
| 6,876,336 B2 | * | 4/2005 | Croswell et al. ......... | 343/795 |
| 6,958,628 B2 | * | 10/2005 | Zanchi ...................... | 326/93 |
| 7,160,754 B2 | * | 1/2007 | Bao et al. ................. | 438/99 |
| 7,442,954 B2 | * | 10/2008 | Clemens et al. ......... | 257/40 |

(Continued)

FOREIGN PATENT DOCUMENTS

DE 103 30 064 B3 12/2004

(Continued)

OTHER PUBLICATIONS

Kawase T, et al., "Inkjet Printed Via-Hole Interconnections and Resistors for All-Polymer Transistor Circuits," Advanced Materials, wiley VCH, Weinheim, Germany, vol. 13, No. 21, Nov. 2, 2001, pp. 1601-1605, XP001129628; ISSN: 0935-9648; p. 1601-p. 1604; figure 4c.

(Continued)

Primary Examiner—Charles D Garber
Assistant Examiner—Pape Sene

(57) ABSTRACT

A method of forming an organic inverter includes providing a first metal layer having a first portion for coupling a source of an OFET to a first power supply voltage, a second portion for coupling a drain of the OFET to an output terminal and a first load resistor terminal, and a third portion for coupling a second load resistor terminal to a second power supply voltage, providing a semiconductor layer for overlapping a portion of the first and second first metal layer portions to form an OFET active area, and for overlapping a portion of the second and third metal layer portions to form a toad resistor, providing a dielectric layer for overlapping the active area of the OFET and the semiconductor area of the load resistor to isolates the first metal layer and semiconductor area from the second metal layer, and providing a second metal layer for overlapping the active area of the OFET to form a gate of the OFET and an input terminal.

19 Claims, 4 Drawing Sheets

U.S. PATENT DOCUMENTS

| | | | |
|---|---|---|---|
| 2002/0039096 A1* | 4/2002 | Katsutani | 345/204 |
| 2002/0047155 A1* | 4/2002 | Babcock et al. | 257/315 |
| 2002/0098604 A1* | 7/2002 | Lin et al. | 438/14 |
| 2003/0059984 A1 | 3/2003 | Sirringhaus et al. | |
| 2005/0040522 A1* | 2/2005 | Takehara et al. | 257/723 |
| 2005/0212937 A1* | 9/2005 | Koyama | 348/301 |
| 2005/0213761 A1* | 9/2005 | Walmsley et al. | 380/255 |
| 2006/0190918 A1* | 8/2006 | Edwards | 716/21 |
| 2006/0220005 A1 | 10/2006 | Fix et al. | |
| 2007/0040165 A1* | 2/2007 | Dimmler et al. | 257/40 |
| 2007/0254402 A1* | 11/2007 | Dimmler et al. | 438/99 |
| 2008/0055131 A1* | 3/2008 | Sexton | 341/143 |
| 2008/0200030 A1* | 8/2008 | Knobloch et al. | 438/678 |
| 2009/0174507 A1* | 7/2009 | Yan et al. | 333/22 R |

FOREIGN PATENT DOCUMENTS

| | | |
|---|---|---|
| DE | 10 2005 042166 A1 | 3/2007 |
| WO | 01/47045 A | 6/2001 |

OTHER PUBLICATIONS

Ullmann, A. et al., "High Performance Organic Field-Effect Transistors and Integrated Inverters" Materials Research Society Symposium Proceedings, Material Research Society, Pittsburgh, PA, vol. 665, Apr. 20, 2001, pp. 265-270, XP008032774, ISSN: 0272-9172; p. 266; figure 1; p. 269; figure 4.

* cited by examiner

NAND GATE

NOR GATE

PRINTED ORGANIC LOGIC CIRCUITS USING AN ORGANIC SEMICONDUCTOR AS A RESISTIVE LOAD DEVICE

FIELD OF INVENTION

The present invention relates to organic electronic devices and circuitry used in printed circuits and, more particularly to a method of fabricating a printed organic inverter using an organic semiconductor as a resistive load.

DESCRIPTION OF RELATED ART

Referring now to FIG. 1A, a prior art design of a basic printed organic inverter 100A is shown, wherein a first P-type OFET (Organic Field-Effect Transistor) is the DRIVER transistor having a source coupled to VDD, a gate for receiving the INPUT signal, and a drain for providing the OUTPUT signal. A second P-type OFET is used as a LOAD transistor having a coupled gate and source coupled to the drain of the first P-type OFET, and a drain coupled to VSS.

Referring now to FIG. 1B, the same organic inverter 100A is shown as inverter 100B, which includes all of the parasitic capacitances associated with the first and second P-type OFETs. A first parasitic capacitance is CGSD, which is associated with the gate and source of the DRIVER transistor. A second parasitic capacitance is CGDD, which is associated with the gate and drain of the DRIVER transistor. Finally, a third parasitic capacitance is CGDL, which is associated with the gate and drain of the LOAD transistor.

One problem with the inverter shown in FIGS. 1A and 1B is that a separate LOAD transistor must be used for the load device. Therefore, the parasitic capacitance, power, fabricating costs, size, and all fabricating steps associated with an OFET transistor must be used. This leads to increased manufacturing costs and reduced performance.

What is desired, therefore, is a practical low cost printing method that can circumvent the described limitations of the prior art to provide a low cost and low power organic inverter.

SUMMARY OF THE INVENTION

According to the present invention, a low-cost and efficient method of fabrication is disclosed that can provide an organic inverter suitable for use in a wide range of applications such as replacing bar codes with active circuitry for even greater control in tracking the movement of individual and packaged goods.

The inverter and method according to an embodiment of the present invention significantly increases the speed and operating frequency of the printed electronic logic circuits into which it is incorporated.

The inverter and method according to an embodiment of the present invention significantly reduces the power consumption of the printed electronic logic circuits into which it is incorporated.

The inverter and method according to an embodiment of the present invention reduces the area occupied by the printed electronic logic circuitry into which it is incorporated, thus allowing for a much denser design.

According to an embodiment of the present invention, a method of forming an organic inverter includes providing a first metal layer having a first portion for coupling a source of an OFET to a first power supply voltage, a second portion for coupling a drain of the OFET to an output terminal and a first load resistor terminal, and a third portion for coupling a second load resistor terminal to a second power supply voltage, providing a semiconductor layer for overlapping a portion of the first and second first metal layer portions to form an OFET active area, and for overlapping a portion of the second and third metal layer portions to form a load resistor, providing a dielectric layer for overlapping the active area and isolates the first metal layer and semiconductor layer from the second metal layer, and providing a second metal layer for overlapping the active area of the OFET to form a gate of the OFET and an input terminal.

The first metal layer is printed using a layer of conductive ink including conductive polymer. The semiconductor layer is printed using a polymer layer including polythiophene. The semiconductor layer comprises a patterned semiconductor layer or a sheet semiconductor layer. The dielectric layer is printed using a polymer layer including non-conductive polymer. The dielectric layer comprises a patterned dielectric layer or a sheet dielectric layer. The second metal layer is printed using a layer of conductive ink including conductive polymer. The first metal layer is typically printed on a substrate that include glass, plastic, cardboard, or any other material normally associated with individual and packaged goods. The OFET in the inverter is typically a P-type transistor, and the load device in the inverter is a simple printed resistor.

BRIEF DESCRIPTION OF THE DRAWINGS

The present invention is illustrated by way of example and not by limitation in the accompanying figures in which like reference numerals indicate similar elements and in which.

DETAILED DESCRIPTION

Figure 2A:
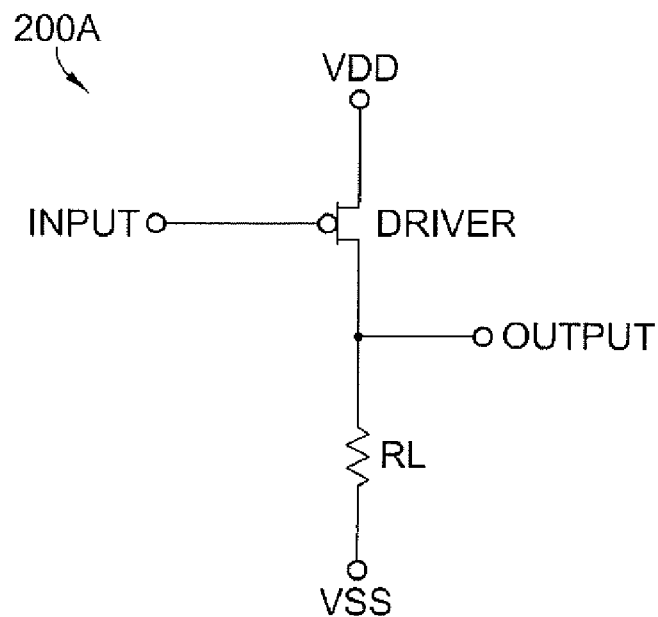
FIG. 2A is a schematic of an organic inverter according to the present invention.

Referring now to FIG. 2A, printed organic inverter 200A is shown, wherein a P-type OFET (Organic Field-Effect Transistor) is the DRIVER transistor having a source coupled to VDD, a gate for receiving the INPUT signal, and a drain for providing the OUTPUT signal. An organic load resistor RL has a first terminal coupled to the drain of the P-type OFET, and a drain coupled to VSS.

Figure 2B:
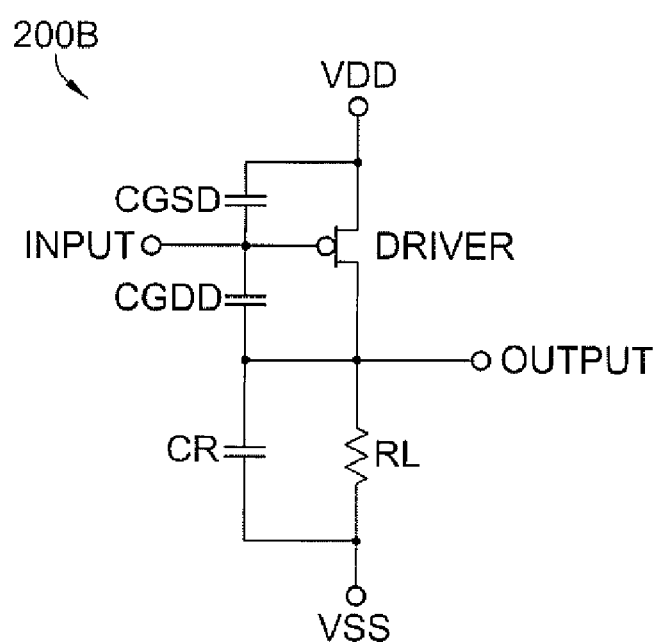
FIG. 2B is a schematic of an organic inverter showing the corresponding parasitic capacitances according to the present invention.

Referring now to FIG. 2B, the same organic inverter 200A is shown as inverter 200B, which includes all of the parasitic capacitances associated with the P-type OFET and the load resistor RL. A first parasitic capacitance is CGSD, which is associated with the gate and source of the DRIVER transistor. A second parasitic capacitance is CGDD, which is associated with the gate and drain of the DRIVER transistor. Finally, a third parasitic capacitance is CR, which is associated with the first and second terminals of the load resistor RL.

Figure 1A:
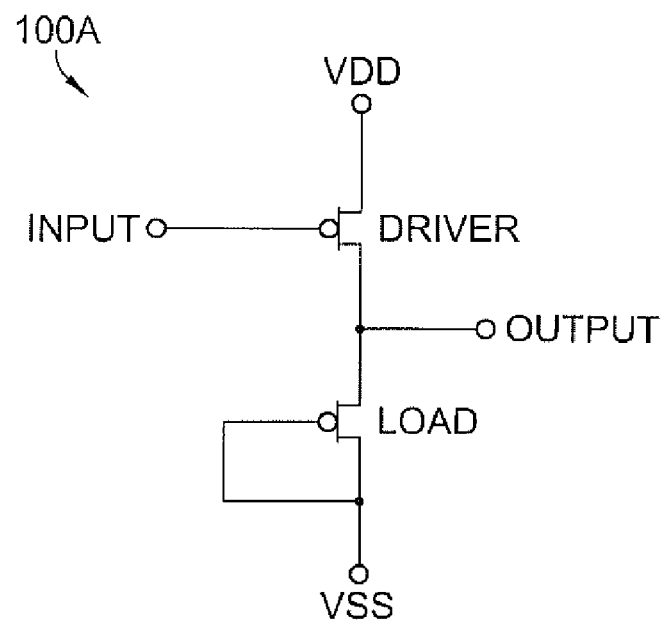
FIG. 1A is a schematic of an organic inverter according to the prior art.
Figure 1B:
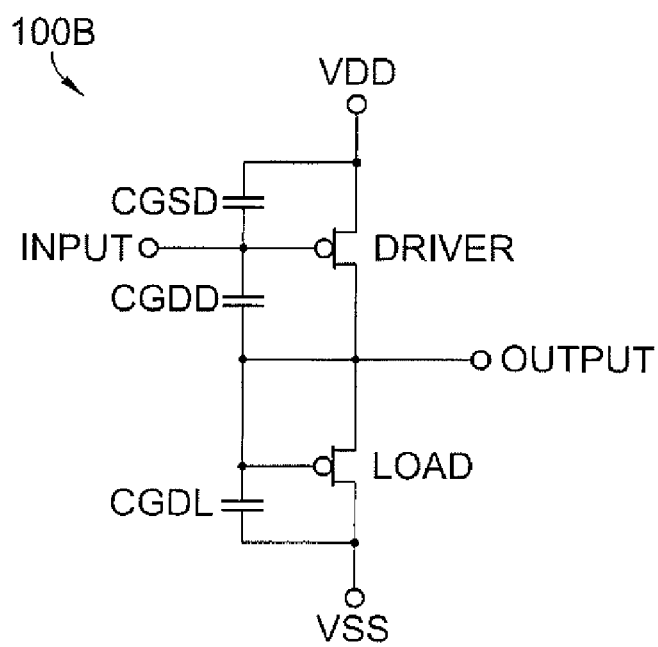
FIG. 1B is a schematic of an organic inverter showing the corresponding parasitic capacitances according to the prior art.

For the organic inverter shown in FIGS. 2A and 2B an organic resistor is used for the load device. All of the parasitic capacitors shown in FIGS. 1B and 2B are parasitic capacitors due to the inherent overlap between the gate and the source/drain metal layers formed in the printing process, except for the CR capacitance shown in FIG. 2B. The parasitic capacitance, CR, associated with the RL load resistor shown in FIG. 2B is orders of magnitude lower than its counterpart parasitic capacitance (CGDL shown in FIG. 1B) because it is a fringe type capacitance and not an overlap capacitance. In a comparison of the circuits shown in FIGS. 1A and 2A, and using the same technology, processing steps, and materials, as well as environmental conditions, the circuit of FIG. 2A is capable of operating at higher speeds. The parasitic capacitance, power, fabricating costs, size, are all smaller or lower when compared to the OFET load device inverter circuit shown in FIG. 1A. One fabricating step associated with an OFET transistor can be eliminated when forming the organic load resistor RL. This leads to decreased manufacturing costs and improved performance.

Figure 3:
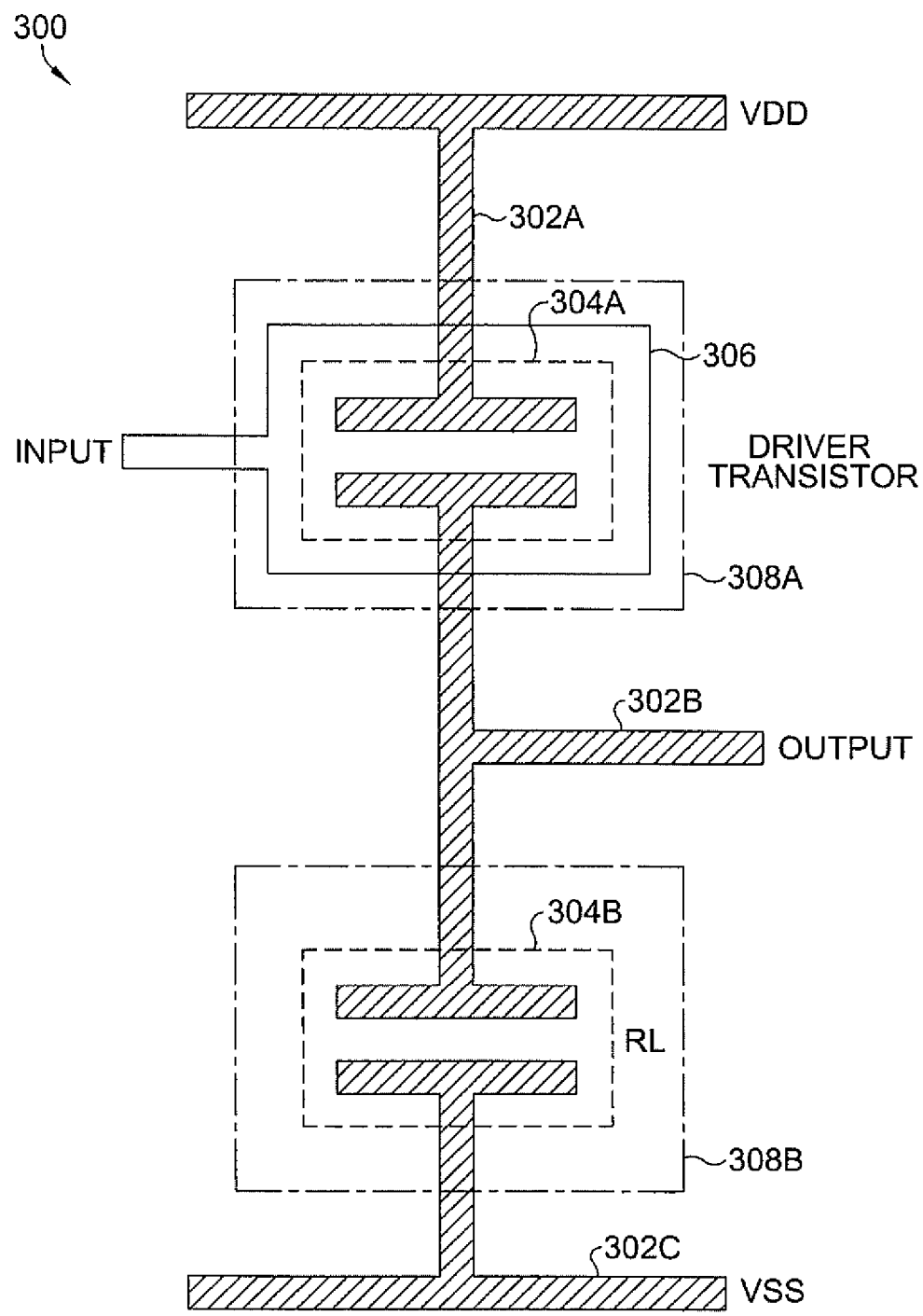
FIG. 3 is a layout of an organic inverter according to the present invention showing a first metal layer, a semiconductor layer, a dielectric layer, and a second metal layer.

Referring now to FIG. 3, a practical low cost printing method that can circumvent the described limitations of the prior art to provide a low cost and low power organic inverter is described with reference to organic inverter layout 300. A method of forming an organic inverter includes providing a first metal layer having a first portion 302A for coupling a source of a DRIVER transistor OFET to a first power supply voltage VDD, a second portion 302B for coupling the drain of the DRIVER transistor OFET to an OUTPUT terminal and a first load resistor RL terminal, and a third portion 302C for coupling a second load resistor RL terminal to a second power supply voltage VSS. Once the first level metal is formed, a semiconductor layer is then formed. A semiconductor layer 304A for overlapping a portion of the first and second first metal layer portions 304A and 304B forms the OFET active area. A semiconductor layer 304B (printed from the same dielectric material as semiconductor layer 304A) for overlapping a portion of the second and third metal layer portions 302B and 302C forms the load resistor RL. Once the semiconductor layer is formed, a dielectric layer is then formed. A dielectric layer 308A overlaps a portion of the first and second metal layer portions 302A and 302B and the semiconductor layer 304A isolates the first metal layer and the semiconductor layer from the second metal layer 306. A dielectric layer 308B (printed from the same dielectric material as dielectric layer 308A) overlaps a portion of the second and third first metal layer portions 302B and 302C and the semiconductor layer 304B isolates the first metal layer and the semiconductor layer 304B from the second metal layer 306. A second metal layer 306 overlaps the active area of the OFET forms a gate of the OFET and an INPUT terminal for the inverter 300.

The first metal layer 302 can be provided by printing a layer of conductive ink. The conductive ink typically comprises conductive polymer although other types of conductive ink can be used. The semiconductor layer 304 comprises printing a polymer layer. The polymer layer typically comprises polythiophene although other types of polymers or other organic semiconductor layers can also be used. Semiconductor layer 304 can be patterned as shown in FIG. 3, or can comprise an un-patterned sheet of material if desired. The dielectric layer 308 comprises printing a polymer layer. The dielectric layer typically comprises non-conductive polymer although other types of polymers or other organic dielectric layers can also be used. Dielectric layer 308 can be patterned as shown in FIG. 3, or can comprise an un-patterned sheet of material if desired. The second metal layer 306 can be provided by printing a layer of conductive ink. The conductive ink typically comprises conductive polymer although other types of conductive ink can be used. The first metal layer 302 is typically printed on a substrate comprising glass, plastic, or cardboard, as well as other packaging materials associated with individual or packaged goods.

In the inverter 300 shown in FIG. 3, the OFET typically comprises a P-type transistor. However, it will be apparent to those skilled in the art that an N-type transistor can also be used with appropriate biasing. The feature sizes for the inverter shown in FIG. 3 can range from a few microns to tens of microns, although these feature sizes will be determined by the exact printing method used, and by the requirements of a specific circuit. The value of the load resistor RL is determined by the equation:

$$RL = (\rho \times W)/L$$

Wherein $\rho$ is the semiconductor resistivity of the organic dielectric material used, W is the length of the two parallel portions of metal layers 302B and 302C forming the first and second terminals of the resistor RL, and L is the corresponding distance between these two metal portions. Although a simple resistor structure is shown in FIG. 3, it will be apparent to those skilled in the art that other structures are possible such as interdigitating metal portions 302B and 302C. Metal portions 302A and 302B associated with the DRIVER transistor OFET can also be interdigitated. When forming the second metal gate of the DRIVER transistor in the inverter 300 shown in FIG. 3, it is important that the patterned metal portion 306 completely overlap the underlying first metal portions 302A and 302B that form the active area of the device.

Figure 4:
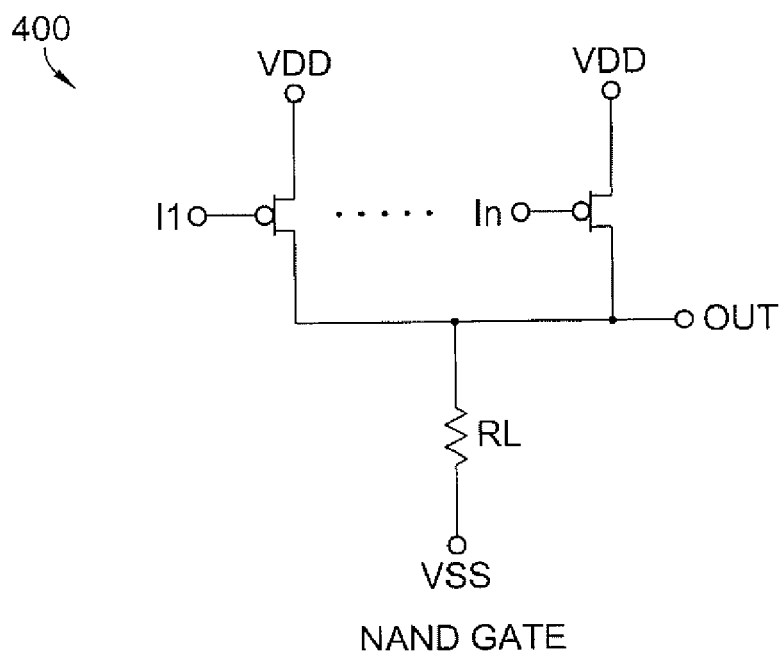
FIG. 4 is a schematic diagram of a NAND gate having multiple parallel driver transistors and a resistive load into which the inverter of the present invention can be incorporated.
Figure 5:
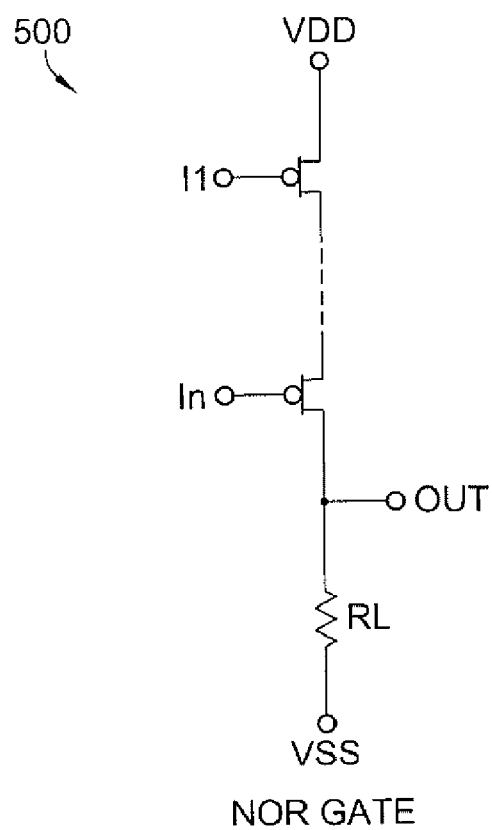
FIG. 5 is a schematic diagram of a NOR gate having multiple serial driver transistors and a resistive load into which the inverter of the present invention can be incorporated.

Referring now to FIGS. 4 and 5, it will be apparent to those skilled in the art that the inverter of the present invention can be incorporated into a NAND gate 400 having multiple parallel DRIVER transistors and a resistive load or into a NOR gate 500 having multiple serial DRIVER transistors. The inverter of the present invention can also be incorporated into other known logic gates.

While the invention has been described in detail in the foregoing description and illustrative embodiment, it will be appreciated by those skilled in the art that many variations may be made without departing from the spirit and scope of the invention. For example, the material selection of the various metal and dielectric layers can be altered as desired for a specific application. In addition, the substitution of the resistor structure of the present invention can be used in other organic logic or analog circuits and is not therefore limited to an inverter. Thus, it may be understood, for example, that the structures above could include a variety of different nanoparticles, polymers and various print methodologies can be used to achieve this result. The process may also include surface treatments at various steps as well as modified transistor structures, including structures such as top-gate top-electrode, top-gate bottom-electrode, bottom gate top-electrode, bottom gate bottom electrode and vertical FETs.

I claim:

1. A method of forming an inverter comprising:
   providing a first metal layer having a first portion for coupling a source of an OFET to a first power supply voltage, a second portion for coupling a drain of the OFET to an output terminal and a first load resistor terminal, and a third portion for coupling a second load resistor terminal to a second power supply voltage;

providing a semiconductor layer overlapping a portion of the first portion of the first metal layer and second portion of the first metal layer to form an OFET active area, and overlapping a portion of the second portion of the first metal layer and third portion of the first metal layer to form a load resistor;

providing a dielectric layer overlapping a portion of the first portion of the first metal layer, second portion of the first metal layer, and the semiconductor layer that form the OFET active area, and overlapping a portion of the second portion of the first metal layer, third portion of the first metal layer and the semiconductor layer that form the load resistor area; and providing a second metal layer overlapping the OFET active area to form a gate of the OFET and an input terminal.

2. The method of claim 1, wherein providing the first metal layer comprises printing a layer of conductive ink.

3. The method of claim 2, wherein the conductive ink comprises conductive polymer.

4. The method of claim 1, wherein providing the semiconductor layer comprises printing a polymer layer.

5. The method of claim 4, wherein the polymer comprises polythiophene.

6. The method of claim 4, wherein the dielectric layer comprises a patterned semiconductor layer.

7. The method of claim 4, wherein the semiconductor layer comprises a sheet semiconductor layer.

8. The method of claim 1, wherein providing the dielectric layer comprises printing a polymer layer.

9. The method of claim 8, wherein the polymer comprises non-conductive polymer.

10. The method of claim 8, wherein the dielectric layer comprises a patterned dielectric layer.

11. The method of claim 8, wherein the dielectric layer comprises a sheet dielectric layer.

12. The method of claim 1, wherein providing the second metal layer comprises printing a layer of conductive ink.

13. The method of claim 12, wherein the conductive ink comprises conductive polymer.

14. The method of claim 1, further comprising providing the first metal layer on a substrate.

15. The method of claim 14, wherein the substrate comprises glass, plastic, or cardboard.

16. The method of claim 1, wherein the OFET comprises a P-type transistor.

17. The method of claim 1, wherein the OFET comprises a N-type transistor.

18. The method of claim 1, further comprising incorporating the inverter into a NAND gate.

19. The method of claim 1, further comprising incorporating the inverter into a NOR gate.

* * * * *